United States Patent
Yang et al.

(10) Patent No.: US 7,405,013 B2
(45) Date of Patent: Jul. 29, 2008

(54) THERMOELECTRIC CONVERSION OF HEAT RELEASED DURING USE OF A POWER-PLANT OR HYDROGEN STORAGE MATERIAL

(75) Inventors: Jihui Yang, Lakeshore (CA); Mark W. Verbrugge, Troy, MI (US); Jan F. Herbst, Grosse Pointe Woods, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 390 days.

(21) Appl. No.: 11/145,857

(22) Filed: Jun. 6, 2005

(65) Prior Publication Data

US 2005/0271916 A1 Dec. 8, 2005

Related U.S. Application Data (60) Provisional application No. 60/577,721, filed on Jun. 7, 2004.

(51) Int. Cl.
*H01L 35/28* (2006.01)

(52) U.S. Cl. .......................... 429/13; 429/26; 420/900

(58) Field of Classification Search ................ 95/90, 95/116; 96/108, 146; 420/900; 206/0.7; 423/648.1; 429/12, 13, 26; 60/551, 649, 60/660

See application file for complete search history.

(56) References Cited

U.S. PATENT DOCUMENTS

| | | | | |
|---|---|---|---|---|
| 4,148,192 | A * | 4/1979 | Cummings | 60/716 |
| 5,753,383 | A * | 5/1998 | Cargnelli et al. | 429/13 |
| 6,029,620 | A * | 2/2000 | Zinke | 123/195 R |
| 6,128,904 | A * | 10/2000 | Rosso et al. | 60/649 |
| 6,461,752 | B1 * | 10/2002 | Leung | 429/20 |
| 6,903,259 | B2 * | 6/2005 | Ciray et al. | 136/205 |
| 6,916,565 | B2 * | 7/2005 | Shioya | 429/19 |
| 6,986,247 | B1 * | 1/2006 | Parise | 60/284 |
| 2006/0003193 | A1 * | 1/2006 | Stabler et al. | 429/9 |

FOREIGN PATENT DOCUMENTS

| | | | |
|---|---|---|---|
| DE | 4118979 A1 | * | 12/1992 |
| JP | 11-111322 A | * | 4/1999 |

* cited by examiner

*Primary Examiner*—Frank M. Lawrence (57) ABSTRACT

A method of generating electrical current in a system comprising a power-plant unit and/or hydrogen storage medium by transferring heat generated by the hydrogen storage medium and/or power-plant unit to a thermoelectric device, and converting the heat to generate electrical current using the thermoelectric device.

27 Claims, 7 Drawing Sheets

THERMOELECTRIC CONVERSION OF HEAT RELEASED DURING USE OF A POWER-PLANT OR HYDROGEN STORAGE MATERIAL

CROSS-REFERENCE TO RELATED APPLICATIONS

This application claims the benefit of U.S. Provisional Application No. 60/577,721, filed on Jun. 7, 2004.

FIELD OF THE INVENTION

The present invention relates to power-plant and fuel cell systems, and more particularly to recovering wasted thermal energy in such systems.

BACKGROUND OF THE INVENTION

Power-plant systems include fuel cell systems. Fuel cell systems are increasingly used as power sources in a wide variety of applications. Fuel cell propulsion systems have also been proposed for use in vehicles as a replacement for internal combustion engines. The fuel cells generate electricity that is used to charge batteries and/or to power electric motors. A solid-polymer-electrolyte fuel cell includes a membrane that is sandwiched between an anode and a cathode. To produce electricity through an electrochemical reaction, a fuel, commonly hydrogen ($H_2$), but also either methane ($CH_4$) or methanol ($CH_3OH$), is supplied to the anode and an oxidant, such as oxygen ($O_2$) is supplied to the cathode. The source of the oxygen is commonly air.

In a first half-cell reaction, dissociation of the hydrogen ($H_2$) at the anode generates hydrogen protons ($H^+$) and electrons ($e^-$). The membrane is proton conductive and dielectric. As a result, the protons are transported through the membrane. The electrons flow through an electrical load (such as the batteries or electric motors) that is connected across the membrane. In a second half-cell reaction, oxygen ($O_2$) at the cathode reacts with protons ($H^+$), and electrons ($e^-$) are taken up to form water ($H_2O$).

Hydrogen storage is a key enabling technology for the advancement of fuel cell power systems in transportation, stationary, and portable applications. Absorptive hydrogen storage systems have been developed where hydrogen is absorbed directly into a bulk storage material. Such bulk storage materials include metal hydrides. In simple crystalline metal hydrides, absorption occurs by the incorporation of atomic hydrogen into interstitial sites in the crystallographic lattice structure. More specifically, the metal hydride is charged by injecting hydrogen at elevated temperature and/or pressure into a container filled with metal hydride particles. The hydrogen bonds with the material and releases heat in the process.

SUMMARY OF THE INVENTION

In one aspect, the present invention relates to a hydrogen storage system that comprises a hydrogen storage medium that generates heat via an exothermic reaction, and a thermoelectric device that is in heat exchange relationship with the hydrogen storage medium and that generates an electric current using the heat generated by the exothermic reaction. In some embodiments, the exothermic reaction occurs when the hydrogen storage material absorbs hydrogen.

In another aspect, the invention relates to a method of generating electrical current in a hydrogen storage system that comprises inducing an exothermic reaction in a hydrogen storage medium, transferring heat generated by the exothermic reaction to a first side of a thermoelectric device, and converting the heat to electrical current using the thermoelectric device.

In one embodiment, the invention relates to a fuel cell system that comprises a fuel cell stack and a hydrogen storage system that supplies hydrogen to the fuel cell stack, which comprises a hydrogen storage medium and a thermoelectric device that is in heat exchange relationship with the hydrogen storage medium and that generates an electric current using heat generated by the hydrogen storage medium.

In another embodiment, the invention relates to a system comprising a power-plant unit that produces effluent heat and a thermoelectric device that generates current using the effluent heat.

In a further embodiment, the invention relates to a system comprising a power-plant unit that produces effluent heat and a thermoelectric device that generates current using the effluent heat, wherein the power-plant unit comprises a diesel engine and the effluent comprises diesel exhaust.

In yet another embodiment, the invention relates to a system comprising a power-plant unit that produces effluent heat and a thermoelectric device that generates current using the effluent heat, wherein the power-plant unit comprises an $H_2$ storage medium and a diesel engine, and the effluent heat is derived from the medium and the engine.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiments is merely exemplary in nature and is in no way intended to limit the invention, its application, or uses.

Figure 1:
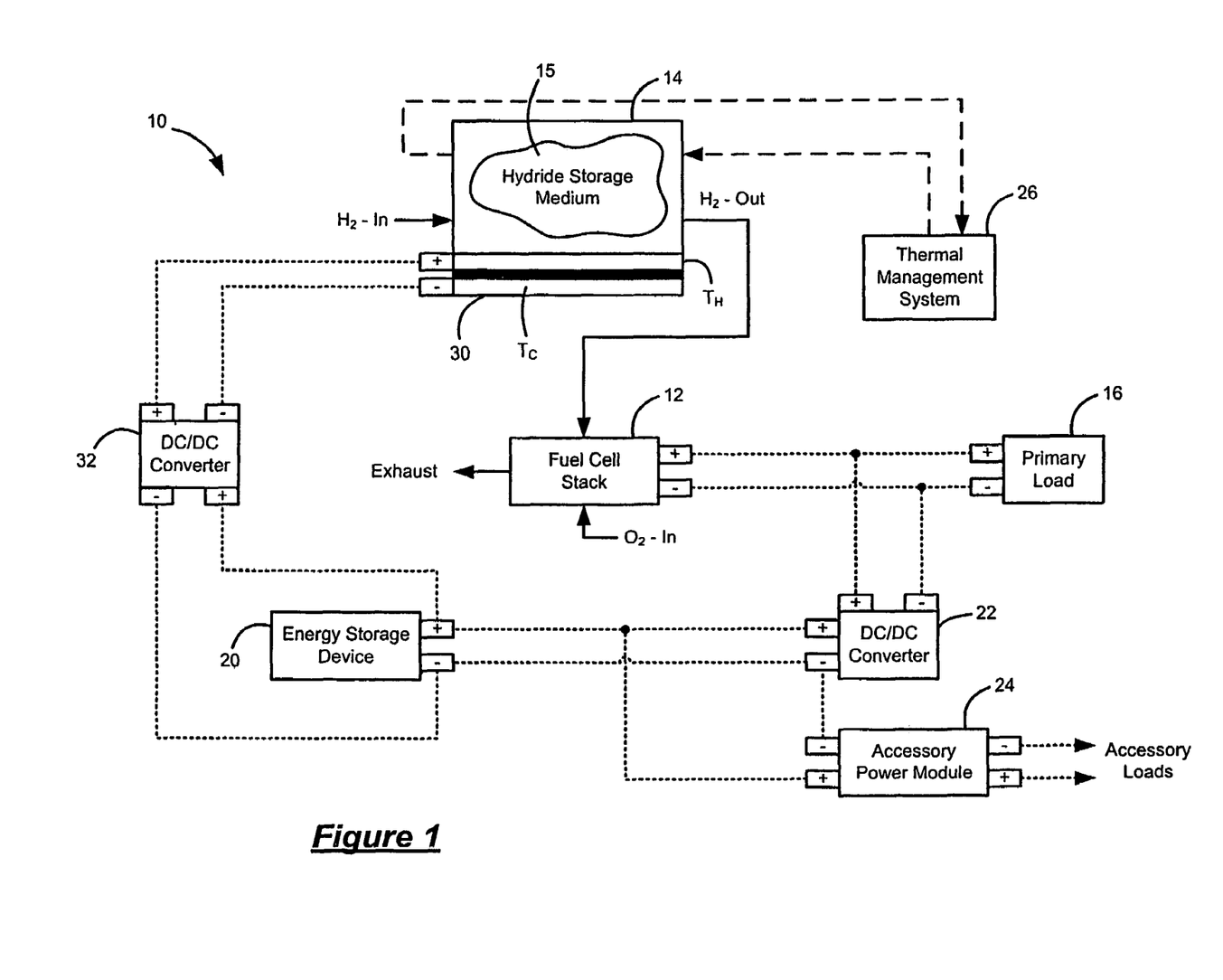
FIG. 1 is a schematic illustration of an exemplary fuel cell system that includes a thermoelectric device according to the present invention.

Referring now to FIG. 1, an exemplary fuel cell system 10 is schematically illustrated. It is anticipated that the fuel cell system 10 can be implemented in a mobile application (e.g., vehicle) or a stationary application (e.g., power plant). The fuel cell system 10 includes a fuel cell stack 12 that generates power by reacting hydrogen ($H_2$) and oxygen ($O_2$). An $H_2$ storage system 14 includes an $H_2$ storage medium 15, exemplified by a hydride that provides $H_2$ to an anode side of the fuel cell stack 12. $O_2$ is supplied to a cathode side of the fuel cell stack 12 from a cathode supply system (not shown). The fuel cell stack 12 powers a primary load 16. In a mobile application, the primary load 16 can include an electric machine that drives a vehicle. In a stationary application, the primary load 16 can include a power grid.

An energy storage device 20 is provided to store power generated by the fuel cell stack 12. The energy storage device 20 can include, but is not limited to, a battery or super-capacitor. The energy storage device 20 is in electrical communication with a DC/DC converter 22. The energy storage device 20 can be used to supplement power to the primary load 16. It is also anticipated that the energy storage device 20 can power accessory loads through an accessory power module 24. Exemplary accessory loads include, but are not limited to, lights, a radio/CD player, electric heaters, powered mirrors, powered seats and the like.

The $H_2$ storage system 14 houses the $H_2$ storage medium 15, which selectively absorbs and desorbs $H_2$. The $H_2$ storage medium 15 is preferably a hydride that generates heat either during an absorption reaction (i.e., exothermic reaction) or during a desorption reaction (i.e., endothermic reaction). Currently employed hydrogen storage materials absorb hydrogen exothermically and desorb or release hydrogen endothermically, however, the present invention contemplates any suitable hydrogen storage material that generates heat via the reversible storage of hydrogen. Exemplary hydrides include, but are not limited to, $LaNi_5H_7$, $Mg_2NiH_4$, $NaAlH_4$, $LiAlH_4$, $TiFeH_2$, $VH_2$, and mixtures thereof. $LaNi_5$ can reach temperatures of up to approximately 900K when hydrided to form $LaNi_5H_7$. $Mg_2Ni$ can reach temperatures of up to approximately 1500K when hydrided to form $Mg_2NiH_4$.

A thermal management system 26 regulates temperatures of components of the fuel cell system 10. The thermal management system 26 circulates a heat transfer fluid that is in heat exchange relationship with various components. In this manner, heat can be transferred from a component to the heat transfer fluid (i.e., heat transfer fluid temperature is lower than component temperature) to lower a temperature of the component. Alternatively, heat can be transferred from the heat transfer fluid to the component (i.e., heat transfer fluid temperature is higher than component temperature) to raise a temperature of the component.

The exemplary fuel cell system 10 of FIG. 1 enables temperature regulation of the $H_2$ storage system 14 using the thermal management system 26. In this manner, the thermal management system 26 can conduct heat generated during absorption of $H_2$ in the $H_2$ storage medium and can provide heat to promote desorption of $H_2$ from the $H_2$ storage medium where the desorption reaction is endothermic and the absorption reaction is exothermic. It is further anticipated that an additional heating device (not shown) can be provided to further promote desorption of $H_2$ from the $H_2$ storage medium where the desorption reaction is endothermic. For example, an electric heater can generate additional heat during periods where the heat transferred from the heat transfer fluid is insufficient to promote desorption. Alternatively, the heating device can operate as the primary desorption heat source, while the heat transfer medium functions as a supplemental desorption heat source.

A thermoelectric device 30 is in heat exchange relationship with the $H_2$ storage medium 15. The thermoelectric device 30 utilizes heat generated by the $H_2$ storage medium 15. The thermoelectric device 30 includes a high temperature side ($T_H$) and a low temperature side ($T_C$), and converts heat from the $H_2$ storage medium 15 into electrical power. The electrical power generated by the thermoelectric device 30 is stored in the energy storage device 20. More specifically, electrical current generated by the thermoelectric device 30 is transferred to the energy storage device 20 through a DC/DC converter 32.

Figure 2:
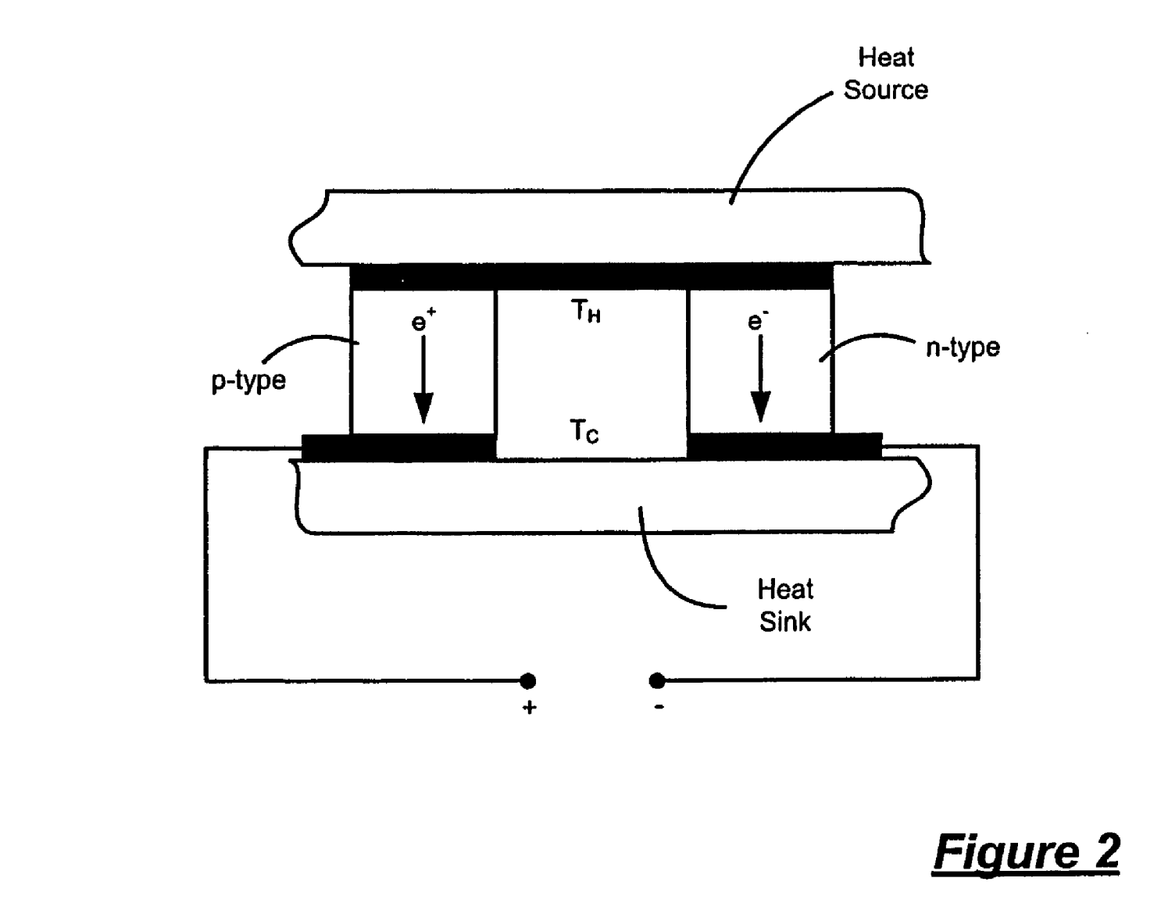
FIG. 2 is a schematic illustration of an exemplary thermoelectric device.

Referring now to FIG. 2, the thermoelectric device 30 will be described in further detail. The thermoelectric device 30 is a solid-state device with no moving parts and includes the high temperature side ($T_H$) and the low temperature side ($T_C$). The thermoelectric device 30 further includes a thermoelectric material having n- (negative) and p- (positive) type semi-conductors that are in heat transfer relationship with the high temperature side and the low temperature side. Electrons move from the n-type semi-conductor to the p-type semi-conductor through an electrical connector. The electrons jump to a higher energy state by absorbing thermal energy at the high temperature side. The electrons flow from the n-type material to the p-type material through an electrical connector dropping to a lower energy state and releasing energy through the low temperature side. The flow of electrical charge or current through the thermoelectric device 30 pumps heat from the high temperature side to the low temperature side. In this manner, the thermoelectric device 30 functions to cool the $H_2$ storage system 14 and to convert thermal energy into electrical energy.

ZT is a dimensionless thermoelectric figure of merit of the thermoelectric material. ZT embodies the relationship of conversion efficiency (i.e., thermal energy to electrical energy) to material properties. ZT is determined according to the following formula:

$$ZT = \frac{TS^e \sigma}{\lambda}$$

where:
T is an average sample temperature (K);
S is the Seebeck coefficient (V/K);
$\sigma$ is the electrical conductivity of the material; and
$\lambda$ is the thermal conductivity of the material.

Figure 3:
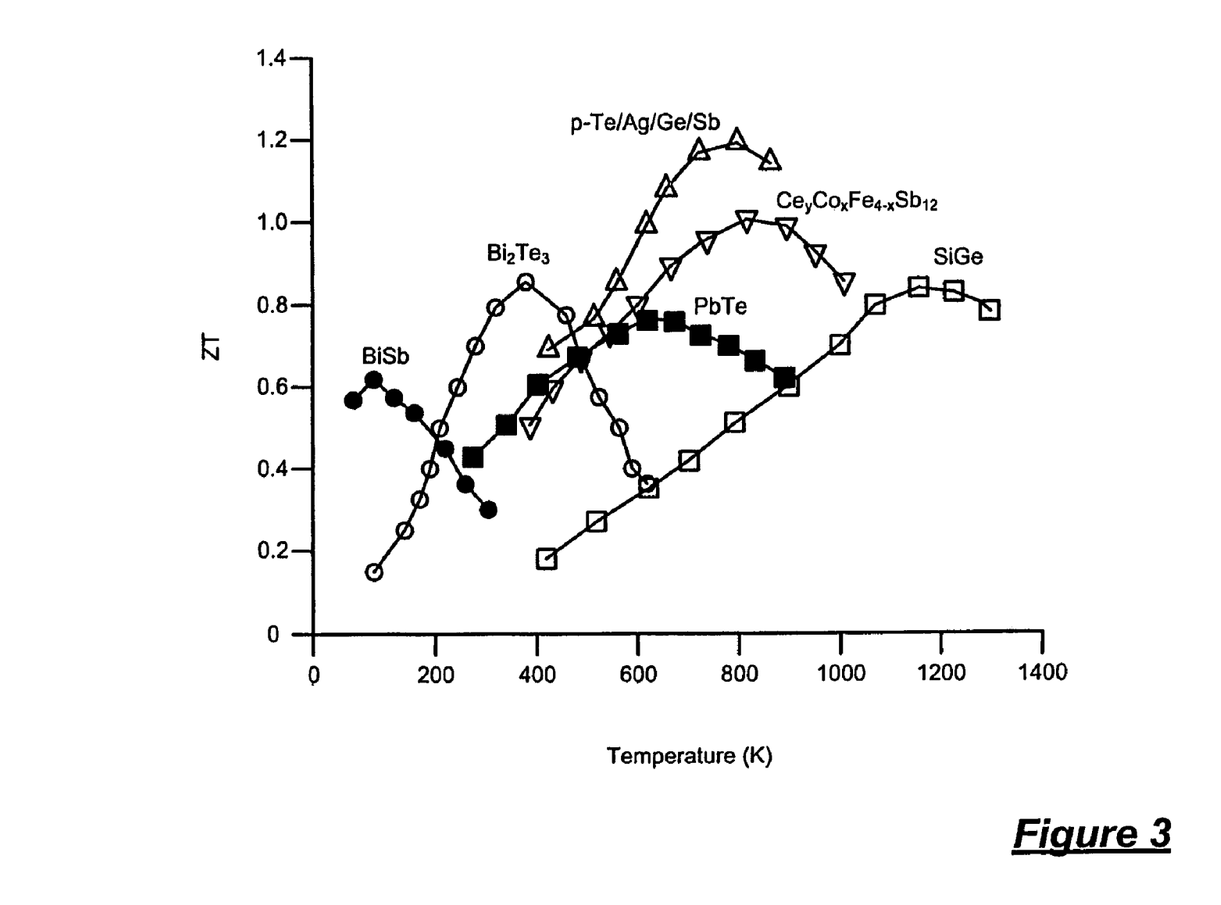
FIG. 3 is a graph illustrating ZT properties for a plurality of exemplary thermoelectric materials.

Referring now to FIG. 3, the electrical properties of thermoelectric materials can change dramatically with temperature. The graph of FIG. 3 illustrates ZT values for six exemplary thermoelectric materials. The ZT values vary based on temperature and each thermoelectric material achieves a maximum ZT value ($ZT_{MAX}$) within a target temperature range ($T_{ZTMAX}$). The ZT value decreases from $ZT_{MAX}$ when moving above or below $T_{ZTMAX}$. For example, a skutterudite thermoelectric (e.g., $Ce_yCo_xFe_{4-x}Sb_{12}$) achieves $ZT_{MAX}$ at approximately 900K. Alternatively, SiGe achieves $ZT_{MAX}$ at approximately 1200K.

Skutterudites are complex materials whose chemical formula is $ReTm_4Pn_{12}$ where Re is a rare earth material (such as cerium), Tm is a transition metal (for instance, iron) and Pn are pnictides (that is, phosphorus, arsenic or antimony). The basic building block of skutterudites consists of a rare earth material that sits in a simple cubic environment of transition metals, each of which is sitting in a tilted pnictide octahedron. Select skutterudites have rather large figure of merits for thermoelectricity; and, as a consequence, they can convert heat into electricity and vice versa.

The conversion efficiency of the thermoelectric device 30 is determined based on ZT. An average, overall efficiency ∈ can be estimated according to the following equation:

$$\varepsilon = \frac{F_{EXH} \cdot \int_{T_C}^{T_H} \frac{T_{AVG} - T_C}{T_{AVG}} \cdot \frac{\sqrt{ZT\left(\frac{T_{AVG} + T_C}{2}\right)} - 1}{\sqrt{ZT\left(\frac{T_{AVG} + T_C}{2}\right)} + \frac{T_C}{T_{AVG}}} dT}{T_H - T_C}$$

where:
$F_{EXH}$ is the heat transfer efficiency from the $H_2$ storage medium;
$T_C$ is the low side temperature;
$T_H$ is the high side temperature; and
$T_{AVG}$ is the average temperature between $T_C$ and $T_H$ This equation accounts for the fact that ZT varies based on temperature. More specifically, this equation determines ∈ based on an effective ZT over a temperature range (i.e., $T_C$ to $T_H$). This equation also accounts for inefficiencies in heat transfer between the $H_2$ storage medium 15 and the thermoelectric device 30.

The fuel cell system 10 is designed to provide the highest ∈. More specifically, the thermoelectric material is selected based on the specific properties of the $H_2$ storage medium 15 to achieve the highest ∈. For example, because a temperature of approximately 900K can be achieved when hydriding $LaNi_5$, these thermal properties make a skutterudite such as $Ce_yCo_xFe_{4-x}Sb_{12}$ desirable to be implemented in the thermoelectric device 30 because it achieves $ZT_{MAX}$ at approximately 900K. Similarly, because a temperature of approximately 1500K can be achieved when hydriding $Mg_2Ni$, SiGe would be implemented in the thermoelectric device 30 because it achieves $ZT_{MAX}$ at approximately 1200K. Accordingly, thermoelectric (TE) materials include, but are not limited to, p-Te/Ag/Ge/Sb, $Ce_yCo_xFe_{4-x}Sb_{12}$, $Bi_2Te_3$, SiGe, PbTe, BiSb, and mixtures thereof.

Figure 4:
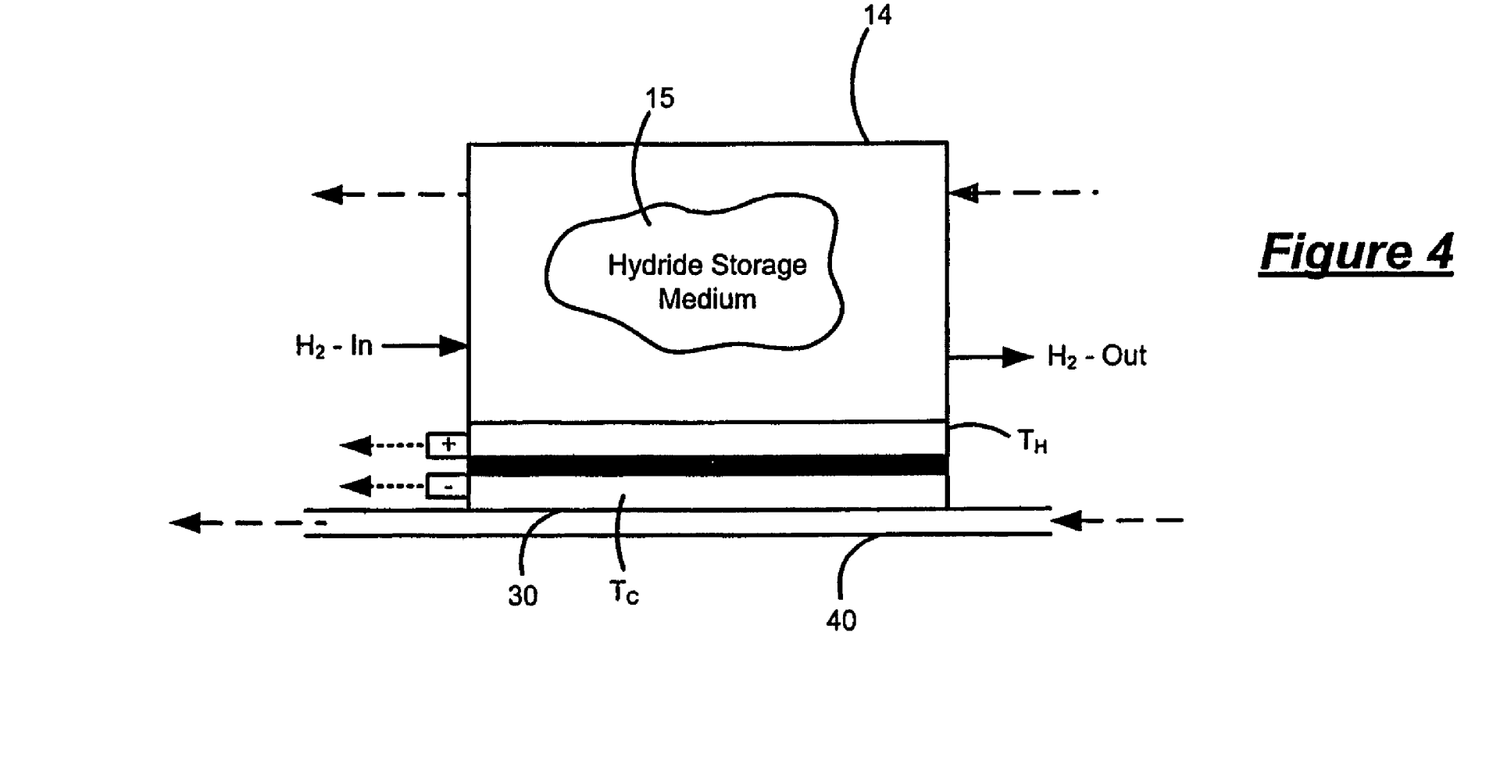
FIG. 4 is a more detailed schematic illustration of a hydrogen storage system of the fuel cell system of FIG. 1.

Referring now to FIG. 4, the thermal management system 26 can be implemented to improve the energy conversion characteristics of the thermoelectric device 30. More specifically, the low temperature side is in heat transfer relationship with a conduit 40 of the thermal management system 26. Heat transfer fluid flowing through the conduit 40 functions as a heat sink to lower the temperature of the low temperature side of the thermoelectric device 30.

The present invention enables electrical energy to be produced from thermal energy that would be otherwise wasted in traditional fuel cell systems. Presently, skutterudite- and SiGe-based thermoelectric devices are able to convert approximately 3% to 4% of the thermal energy into electrical energy. However, as materials science improves, the conversion efficiencies will increase. The estimated heat rates or power released during a typical recharging (e.g., 5 minutes) of an $H_2$ storage medium capable of storing 5 kg of $H_2$, are approximately 260 kW and 530 kW for $LaNi_5$ and $Mg_2Ni$, respectively. As conversion efficiencies improve, tens of kW of electrical energy can be recovered by implementing the thermoelectric device 30.

As discussed above, it will be appreciated that the invention described herein is useable with a $H_2$ storage medium that is endothermic upon $H_2$ uptake (absorption) and exothermic upon $H_2$ release (desorption), in which case the TE device is useable to generate electricity during $H_2$ release. Accordingly, some materials absorb hydrogen endothermally; iron is an example, forming iron hydride. Thus, the invention, in its broadest aspect, contemplates an exothermic reaction conducted in a hydrogen storage medium, where heat is utilized by the thermoelectric device to generate electrical energy. The term "hydrogen storage medium" is used interchangeably with the term "hydrogen storage media."

It is further understood that the invention encompasses thermoelectric (TE) devices to use heat from any power-plant source in any stationary or vehicle application. The term "vehicle" encompasses all devices and structures for transporting persons or things, including automobiles, cars, trucks, buses, locomotives, ships, airplanes, and the like. The invention also encompasses use of heat released from power-plant units, such as internal combustion engines, gasoline engines, diesel engines, and the like.

Figure 5:
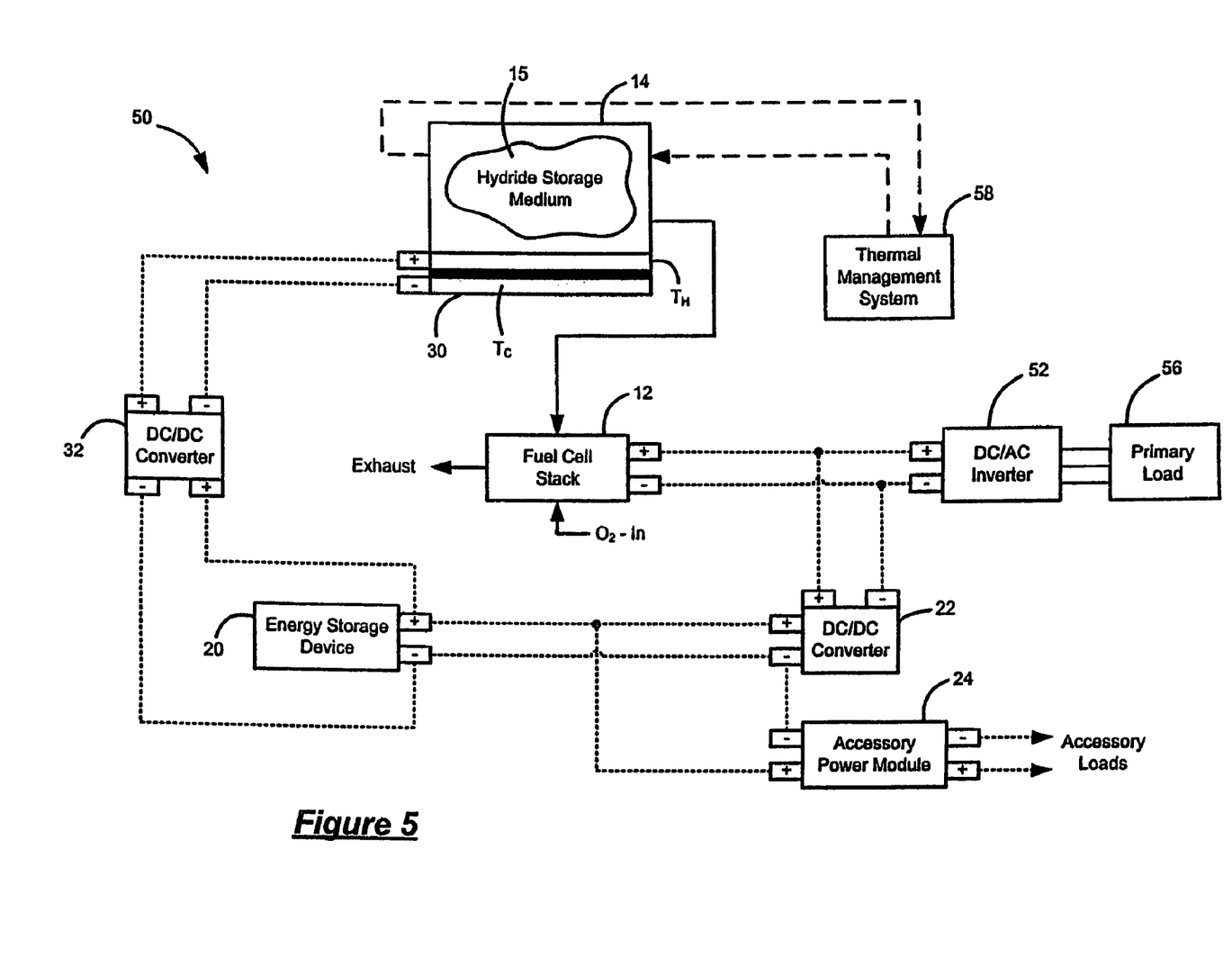
FIG. 5 is a schematic of a preferred embodiment similar to FIG. 1, with the primary load being a traction motor and the DC/DC converter replaced by a DC/AC inverter.

FIG. 5 is an alternate embodiment of the present invention having a fuel cell system 50. The embodiment shown in FIG. 5 is similar to the embodiment shown in FIG. 1, except that the power converter in electrical communication with the primary load is a DC/AC inverter 52 and replaces the DC/DC converter 22 in the embodiment of FIG. 1. In such an embodiment, the primary load 56 is preferably an AC traction motor. A thermal management system 58 is similar to the thermal management system 26 of the embodiment shown in FIG. 1, and regulates temperatures of components of the fuel cell system 50.

Figure 6:
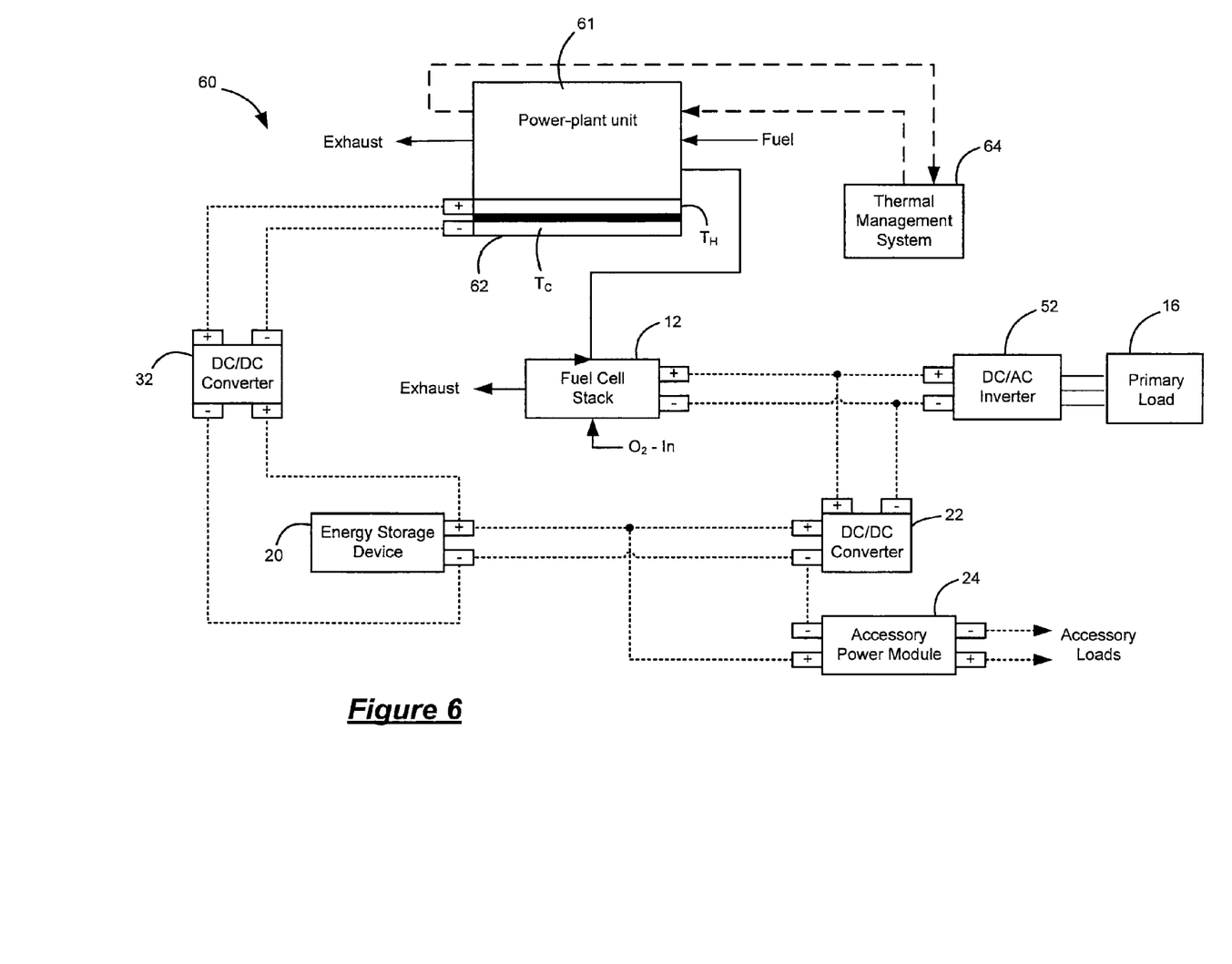
FIG. 6 is a schematic of another preferred embodiment similar to FIG. 1, but with the source of heat being power-plant unit exhaust heat effluent used with a thermoelectric (TE) device and in an option without a fuel cell. An exemplary power-plant unit comprises a diesel engine.

FIG. 6 is a schematic of another preferred embodiment having a power generating system 60 similar to FIG. 1, where the source of heat is a power-plant unit 61. Exemplary power-plants 61 include hydrocarbon internal combustion engines (such as, diesel, gasoline, and the like) that generate heated exhaust or any other source of heated effluent that can be transferred to a thermoelectric material to generate electricity in a power generation unit. It should be noted in the present embodiment that the power generating system 60 does not contain a fuel-cell or a hydrogen storage vessel. A thermoelectric device 62 is in thermal communication with the power-plant 61 and generates electricity in the same manner as described above in the context of thermoelectric devices for hydrogen storage vessels. The thermoelectric device 62 includes a thermoelectric material that generates electricity transferred to the DC/DC converter 32. Further, in the present embodiment, the primary load 56 is preferably an AC traction motor and the DC/AC inverter 52 provides power to the primary load/AC motor 56. A thermal management system 64 is similar to the thermal management systems 26 of the embodiment shown in FIG. 1 and 58 of the embodiment shown in FIG. 5, and regulates temperatures of components of the power generating system 60. The thermal management system 64 circulates a heat transfer fluid that is in heat exchange relationship with various components. An exemplary thermal management system 64 for an internal combustion power generating system 60 is a radiator.

Figure 7:
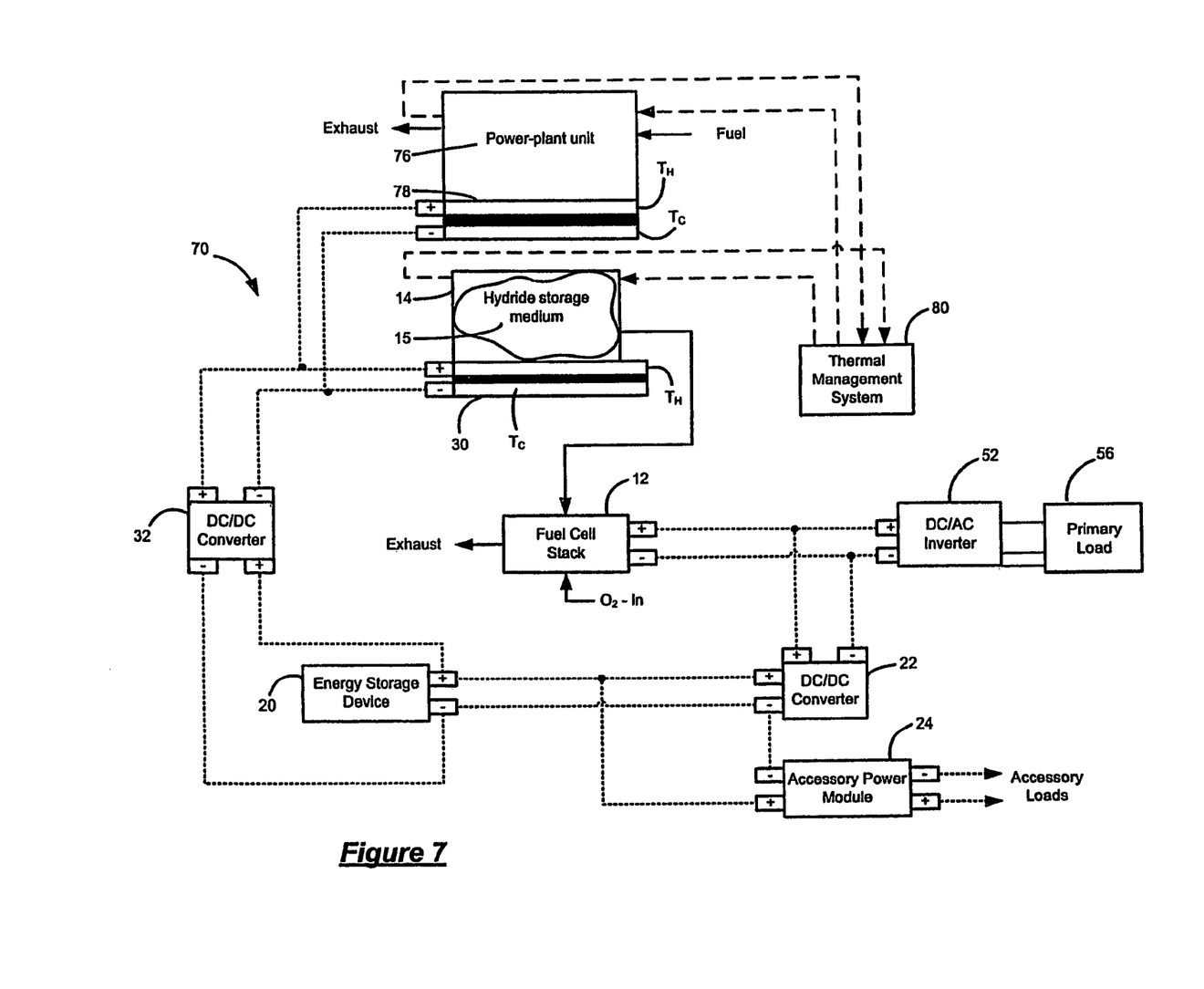
FIG. 7 is yet another schematic of another preferred embodiment similar to FIG. 1, with TE devices used with respective diesel engine heat source and hydrogen storage medium heat source. Here the exemplary power-plant unit comprises a fuel cell and a diesel engine.

FIG. 7 is depicts another preferred embodiment of the present invention similar to FIG. 1, showing a power generating system 70 comprising a power-plant unit 76. The power generating system 70 also comprises the fuel cell 12 and $H_2$ storage system 14 having the hydrogen storage medium 15.

Both the power-plant unit 76 and fuel cell 12 are in thermal communication with thermoelectric devices, 78 and 30, respectively. Exemplary power-plants 76 include hydrocarbon internal combustion engines (such as, diesel, gasoline, and the like) that generate heated exhaust or any other source of heated effluent that can be transferred to the TE material to generate electricity. As described previously, the primary load 56 can be an AC traction motor, and in such a case, power is provided to the primary load 56 by a DC/AC inverter 52. A thermal management system 80 regulates temperatures of components of the fuel cell system 70, including the power-plant unit 76 and the fuel cell 12.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A hydrogen storage system, comprising:
    a hydrogen storage medium that generates heat via an exothermic reaction; and
    a thermoelectric device that is in heat exchange relationship with said hydrogen storage medium and that generates an electric current using said generated heat via said exothermic reaction; and
    a thermal management system that provides a heat sink to a low temperature side of said thermoelectric device.

2. The hydrogen storage system of claim 1, wherein said exothermic reaction is a hydrogen absorption reaction.

3. The hydrogen storage system of claim 1 wherein said hydrogen storage medium comprises a hydride.

4. The hydrogen storage system of claim 3 wherein said hydrogen storage medium comprises a hydride selected from the group consisting of $LaNi_5H_7$, $Mg_2NiH_4$, $NaAlH_4$, $LiAlH_4$, $TiFeH_2$, and $VH_2$, and mixtures thereof.

5. The hydrogen storage system of claim 1 wherein said thermoelectric device comprises a thermoelectric material.

6. The hydrogen storage system of claim 5 wherein said thermoelectric material comprises at least one material selected from the group consisting of a skutterudite, p-Te/Ag/Ge/Sb, $Ce_yCo_xFe_{4-x}Sb_{12}$, $Bi_2Te_3$, SiGe, PbTe, BiSb, and mixtures thereof.

7. The hydrogen storage system of claim 1 wherein said thermoelectric device includes a thermoelectric material that has a peak energy conversion characteristic within a target temperature range.

8. The hydrogen storage system of claim 7 wherein said hydrogen storage medium is selected to generate sufficient heat during said exothermic reaction to achieve a temperature within said target temperature range at a high temperature side of said thermoelectric device.

9. A method of generating electrical current in a hydrogen storage system, comprising:
    conducting an exothermic reaction in a hydrogen storage medium;
    transferring heat generated by said exothermic reaction to a first side of a thermoelectric device;
    converting said heat to electrical current using said thermoelectric device and further providing heat transfer with a thermal management system to provide a heat sink for said thermoelectric device.

10. The method of claim 9 further comprising selecting a material of said thermoelectric device based on thermal properties of said hydrogen storage medium.

11. The method of claim 9 wherein said hydrogen storage medium comprises a hydride.

12. The method of claim 11 wherein said hydrogen storage medium comprises a hydride selected from the group consisting of $LaNi_5H_7$, $Mg_2NiH_4$, $NaAlH_4$, $LiAlH_4$, $TiFeH_2$, and $VH_2$, and mixtures thereof.

13. The method of claim 9 wherein said thermoelectric device comprises a thermoelectric material.

14. The method of claim 13 wherein said thermoelectric material comprises at least one material selected from the group consisting of a skutterudite, p-Te/Ag/Ge/Sb, $Ce_yCo_xFe_{4-x}Sb_{12}$, $Bi_2Te_3$, SiGe, PbTe, BiSb, and mixtures thereof.

15. The method of claim 9 wherein said thermoelectric device includes a thermoelectric material that has a peak energy conversion characteristic within a target temperature range.

16. The method of claim 15 further comprising selecting said hydrogen storage medium to generate sufficient heat during said exothermic reaction to achieve a temperature within said target temperature range at a high temperature side of said thermoelectric device.

17. A fuel cell system, comprising:
    a fuel cell stack; and
    a hydrogen storage system that supplies hydrogen to said fuel cell stack comprising:
    a hydrogen storage medium that generates heat via an exothermic reaction;
    a thermoelectric device that is in heat exchange relationship with said hydrogen storage medium and that generates an electric current using said heat generated by said exothermic reaction; and
    a thermal management system that provides a heat sink to a low temperature side of said thermoelectric device.

18. The fuel cell system of claim 17 wherein said hydrogen storage medium comprises a hydride.

19. The fuel cell system of claim 18 wherein said hydrogen storage medium comprises a hydride selected from the group consisting of $LaNi_5H_7$, $Mg_2NiH_4$, $NaAlH_4$, $LiAlH_4$, $TiFeH_2$, and $VH_2$, and mixtures thereof.

20. The fuel cell system of claim 17 wherein said thermoelectric device comprises a thermoelectric material.

21. The fuel cell system of claim 20 wherein said thermoelectric material comprises at least one material selected from the group consisting of a skutterudite, p-Te/Ag/Ge/Sb, $Ce_yCo_xFe_{4-x}Sb_{12}$, $Bi_2Te_3$, SiGe, PbTe, BiSb, and mixtures thereof.

22. The fuel cell system of claim 17 wherein said thermoelectric device includes a thermoelectric material that has a peak energy conversion characteristic within a target temperature range.

23. The fuel cell system of claim 22 wherein said hydrogen storage medium is selected to generate sufficient heat during said exothermic reaction to achieve a temperature within said target temperature range at a high temperature side of said thermoelectric device.

24. A fuel cell system, comprising:
    a fuel cell stack; and
    a hydrogen storage system that supplies hydrogen to said fuel cell stack, comprising:
    a hydrogen storage medium;
    a thermoelectric device that is in heat exchange relationship with said hydrogen storage medium and that generates an electric current using heat generated by said hydrogen storage medium; and
    a thermal management system that provides a heat sink to a low temperature side of said thermoelectric device.

25. The fuel cell system of claim 24 wherein said heat is generated when said hydrogen storage medium absorbs hydrogen.

26. The fuel cell system of claim 24 wherein said heat is generated when said hydrogen storage medium desorbs hydrogen.

27. A system comprising a power-plant unit that comprises a hydrogen storage medium and a diesel engine where said power-plant unit produces effluent heat and a thermoelectric device that generates current using said effluent heat.

* * * * *